(12) United States Patent
Bornert et al.

(10) Patent No.: US 10,088,543 B2
(45) Date of Patent: Oct. 2, 2018

(54) PARALLEL MULTI-SLICE MR IMAGING USING PHASE-MODULATED RF PULSES

(71) Applicant: KONINKLIJKE PHILIPS N.V., Eindhoven (NL)

(72) Inventors: Peter Bornert, Eindhoven (NL); Mariya Ivanova Doneva, Eindhoven (NL); Kay Nehrke, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 436 days.

(21) Appl. No.: 14/774,314

(22) PCT Filed: Mar. 11, 2014

(86) PCT No.: PCT/IB2014/059613
§ 371 (c)(1),
(2) Date: Sep. 10, 2015

(87) PCT Pub. No.: WO2014/141055
PCT Pub. Date: Sep. 18, 2014

(65) Prior Publication Data
US 2016/0018499 A1 Jan. 21, 2016

Related U.S. Application Data

(60) Provisional application No. 61/788,816, filed on Mar. 15, 2013.

(51) Int. Cl.
*G01V 3/00* (2006.01)
*G01R 33/561* (2006.01)
(Continued)

(52) U.S. Cl.
CPC .......... *G01R 33/5611* (2013.01); *G01R 33/36* (2013.01); *G01R 33/385* (2013.01); *G01R 33/4835* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS 6,326,786 B1   12/2001   Pruessmann et al.
6,366,092 B1   4/2002    Enholm et al.
(Continued)

FOREIGN PATENT DOCUMENTS

WO   2012054768 A1   4/2012
WO   2016180640 A1   11/2016

OTHER PUBLICATIONS

Larkman et al "Use of Multicoil Arrays for Separation of Signal From Multiple Slices Simultaneously Excited" Journal of Magnetic Resonance Imaging 13 (2001) p. 313-317.
(Continued)

*Primary Examiner* — Walter L Lindsay, Jr.
*Assistant Examiner* — Frederick Wenderoth

(57) ABSTRACT

The invention relates to a method of MR imaging of an object (10) placed in an examination volume of a MR device (1). The method comprises the steps of: —subjecting the object (10) to an imaging sequence comprising phase-modulated multi-slice RF pulses for simultaneously exciting two or more spatially separate image slices, —acquiring MR signals, wherein the MR signals are received in parallel via a set of at least two RF coils (11, 12, 13) having different spatial sensitivity profiles within the examination volume, and —reconstructing a MR image for each image slice from the acquired MR signals, wherein MR signal contributions from the different image slices are separated on the basis of the spatial sensitivity profiles of the at least two RF coils (11, 12, 13) and on the basis of the phase modulation scheme of the RF pulses. In order to optimize the conditioning of the
(Continued)

inverse problem of the MR image reconstruction, the phase-modulation scheme of the RF pulses is derived from the spatial sensitivity profiles of the at least two RF coils (11, 12, 13). Moreover, the invention relates to a MR device for carrying out this method as well as to a computer program to be run on a MR device.

9 Claims, 2 Drawing Sheets

(51) Int. Cl.
    *G01R 33/36* (2006.01)
    *G01R 33/385* (2006.01)
    *G01R 33/483* (2006.01)

(58) Field of Classification Search
    USPC ......................................................... 324/309
    See application file for complete search history.

(56) References Cited

U.S. PATENT DOCUMENTS

| | | | |
|---|---|---|---|
| 6,522,140 B2 | 2/2003 | Harvey | |
| 7,002,344 B2 | 2/2006 | Griswold et al. | |
| 7,463,920 B2 | 12/2008 | Purdy | |
| 7,859,263 B2 | 12/2010 | Matsuda et al. | |
| 2008/0129298 A1* | 6/2008 | Vaughan | G01R 33/5612 324/322 |
| 2009/0030760 A1* | 1/2009 | Langhoff | G06Q 10/063 705/7.37 |
| 2009/0257629 A1* | 10/2009 | Fuderer | G01R 33/3415 382/128 |
| 2011/0254548 A1* | 10/2011 | Setsompop | G01R 33/4835 324/309 |
| 2012/0001633 A1* | 1/2012 | Fuderer | G01R 33/5611 324/309 |
| 2012/0319686 A1 | 12/2012 | Jesmanowicz et al. | |
| 2016/0018499 A1 | 1/2016 | Bornert et al. | |

OTHER PUBLICATIONS

Breuer et al "Controlled Aliasing in Parallel Imaging Results in Higher Acceleration for Multi-slice Imaging" Magnetic Resonance in Medicine 53 (2005) p. 684-691.
Zhu et al "Autocalibrating Caipirinha:Reformulating Caipirinha as a 3D Problem" Proc. Intl. Soc. Mag. Reson. Med. 20 (2012) p. 518-.
Zutzy et al "Improvements in Multislice Parallel Imaging Using Radical Caipirinha" Magnetic Resonance in Medicine 65: p. 1630-1637 (2011).
Breuer et al Controlled Aliasing in Volumetric Parallel Imaging (2D Caipirinha) Magnetic Resonance in Medicine 55 p. 549-556 (2006).
Weaver "Simultaneous Multislice Acquistion of MR Images" Magnetic Resonance in Medicine 8 (1988) Nov. No. 3., p. 275-284.
Setsompop et al "Blipped Controlled Aliasing in Parallel Imaging for Simultanous Multislice Echo.." Magnetic Resonance in Medicine 67: (2012) p. 1210-1224.
Pruessmann et al "Sense: Sensitivity Encoding for Fast MRI" Magnetic Resonance in Medicine 42 (1991) p. 952-562.
Stab et al "Caipirinha Accelerated SSFP Imaging" Magnetic Resonance in Med. 65: p. 157-164 (2011).

* cited by examiner

PARALLEL MULTI-SLICE MR IMAGING USING PHASE-MODULATED RF PULSES

CROSS-REFERENCE TO PRIOR APPLICATIONS

This application is the U.S. National Phase application under 35 U.S.C. § 371 of International Application No. PCT/IB2014/059613, filed on Mar. 11, 2014, which claims the benefit of U.S. Patent Application No. 61/788,816, filed on Mar. 15, 2013. These applications are hereby incorporated by reference herein.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

SUMMARY OF THE INVENTION

According to the MR method in general, the object, for example the body of the patient to be examined, is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

To realize spatial resolution in the body, constant magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines acquired with different phase encoding. Each line is digitized by collecting a number of samples. A set of k-space data is converted to a MR image by means of an image reconstruction algorithm.

Recently, techniques for accelerating MR acquisition have been developed which are called parallel acquisition. Methods in this category are SENSE (Sensitivity Encoding), SMASH (Simultaneous Acquisition of Spatial Harmonics), and GRAPPA (Generalized Auto-calibrating Partially Parallel Acquisition). SENSE, SMASH, and GRAPPA and other parallel acquisition techniques use undersampled k-space data acquisition obtained from multiple RF receiving coils in parallel. In these methods, the (complex) signal data from the multiple coils are combined with complex weightings in such a way as to suppress undersampling artifacts (aliasing) in the finally reconstructed MR images. This type of complex array signal combination is sometimes referred to as spatial filtering, and includes combining which is performed in the k-space domain (as in SMASH and GRAPPA) or in the image domain (as in SENSE), as well as methods which are hybrids.

Larkman et al. (Journal of Magnetic Resonance Imaging, 13, 313-317, 2001) proposed to apply sensitivity encoding also in the slice direction in case of multi-slice imaging to increase scan efficiency. Breuer et al. (Magnetic Resonance in Medicine, 53, 684-691, 2005) improved this basic idea proposing an approach termed "controlled aliasing in parallel imaging results in higher acceleration" (CAIPIRINHA). This technique modifies the appearance of aliasing artifacts in each individual slice during the multi-slice acquisition improving the subsequent parallel image reconstruction procedure. Thus, CAIPIRINHA is a parallel multi-slice imaging technique which is more efficient compared to other multi-slice parallel imaging concepts that use only a pure post-processing approach. In CAIPIRINHA, multiple slices of arbitrary thickness and distance are excited simultaneously with the use of phase-modulated multi-slice RF pulses (similar to the known Hadamard pulses). The acquired MR signal data are undersampled, yielding superimposed slice images that appear shifted with respect to each other. The shift of the aliased slice images is controlled by the phase-modulation scheme of the RF pulses in accordance with the Fourier shift theorem. From phase-encoding step to phase-encoding step, the multi-slice RF pulses apply an individual phase shift to the MR signals of each slice. The numerical conditioning of the inverse reconstruction problem, separating the individual signal contributions of the involved slices, is improved by using this shift. CAIPIRINHA has the potential to improve the separation of the superimposed slice images also in cases in which the slices are rather close to each other such that the coil sensitivities of the used RF receiving coils do not differ dramatically in the individual slices to be imaged. However, CAIPIRINHA has limitations.

CAIPIRINHA uses a fixed phase-modulation scheme of the RF pulses, resulting in a relative shift of adjacent slices by, for example, half the dimension of the field-of-view (FOV) or some other integer fraction of the dimension of the FOV. A drawback of this fixed scheme is that it does not take a-priory information into account. Thus, the encoding capabilities of the array of receiving RF coils and also the basic structure of the imaging problem are not sufficiently considered. This may result in a sub-optimal phase-modulation and consequently in sub-optimal reconstruction performance.

From the foregoing it is readily appreciated that there is a need for an improved parallel multi-slice MR imaging technique.

In accordance with the invention, a method of MR imaging of an object placed in an examination volume of a MR device is disclosed. The method comprises the steps of:

subjecting the object to an imaging sequence comprising phase-modulated multi-slice RF pulses for simultaneously exciting two or more spatially separate image slices, acquiring MR signals, wherein the MR signals are received in parallel via a set of at least two RF coils having different spatial sensitivity profiles within the examination volume, and reconstructing a MR image for each image slice from the acquired MR signals, wherein MR signal contributions from the different image slices are separated on the basis of the spatial sensitivity profiles of the at least two RF coils and on the basis of the phase modulation scheme of the RF pulses. The invention proposes that the phase-modulation scheme of the RF pulses is derived from the spatial sensitivity profiles of the at least two RF coils.

The technique of the invention generally corresponds to the known CAIPIRINHA approach. The application of relative shifts between the image slices as described above by means of phase-modulated multi-slice RF pulses increases the effective differences between the coil sensitivities at the locations of voxels that fold together in the superimposed slice images and therefore improves the conditioning of the reconstruction problem. However, no fixed phase-modulation scheme as in CAIPIRINHA is applied according to the invention. Instead, the available coil sensitivity information is used to derive adjusted slice specific phase modulations to optimize the encoding process and, thus, the conditioning of the unfolding problem in order to improve the final image quality.

In a preferred embodiment of the invention, phase-encoded MR signals are acquired by means of the imaging sequence, the phase modulation scheme comprising a varying phase shift, such that an individual phase cycle is applied to the MR signals of each image slice. Preferably, the phase shift is linearly incremented from phase-encoding step to phase-encoding step, with an individual phase increment being applied to each image slice. In this way, the individual shift of each slice image is controlled by the phase-modulation scheme of the RF pulses in accordance with the Fourier shift theorem.

In accordance with a preferred embodiment of the invention, the MR signals are acquired with undersampling in the in-plane direction of the image slices. The MR images of the image slices can be reconstructed in this case by using a per se known parallel image reconstruction algorithm, like SENSE, SMASH or GRAPPA.

In the following, the technique of the invention is explained in more detail:

At first, one voxel at the same in-plane location r in all N different image slices is considered without phase modulation of the multi-slice RF pulses. The corresponding acquired MR signal in each of the M receive coils can be written matrix vector notation as $$Sx=y,$$

wherein the vector y denotes the acquired MR signals in each of the M RF coils, as a linear combination of the sensitivity-weighted signal contributions $x_i$ of the N different image slices, whereas matrix S denotes the (N×M) sensitivity matrix. As an example, the above equation can be written as $$\begin{pmatrix} S_{11} & S_{12} & S_{13} \\ S_{21} & S_{22} & S_{23} \\ S_{31} & S_{32} & S_{33} \\ S_{41} & S_{42} & S_{43} \end{pmatrix} \begin{pmatrix} x_1 \\ x_2 \\ x_3 \end{pmatrix} = \begin{pmatrix} y_1 \\ y_2 \\ y_3 \\ y_4 \end{pmatrix}$$

for an exemplary embodiment using M=4 coils and N=3 slices, with $S_{ij}$ being the coil sensitivity for coil j and slice i. Solving this system of equations including inversion of the encoding matrix yields the vector x, which contains the corresponding N slice specific MR signals:

$$(S^H S)^{-1} S^H y = x$$

The matrix $(S^H S)^{-1} S^H$ is the pseudo-inverse of S and its norm describes the error propagation from the MR signal acquisitions into the final image. This norm is small in case of a good conditioning.

According to the invention, the resulting condition number is influenced by applying appropriate phase-modulations during the MR signal acquisition process for the different image slices, which change the individual elements of S as a result. Actually, only (N×M−M) elements have to be considered because phase-modulation for the first image slice has not to be performed, which means it is sufficient to considerer only those matrix element $S_{ij}$ with i>1.

Slice dependent in-plane shifts $\Delta_1$ and $\Delta_2$ (in the three-slice excitation experiment of this exemplary embodiment) are chosen as fractions of the FOV in the phase-encoding direction appropriately, to modify the actual coil sensitivities during MR signal acquisition:

$$\begin{pmatrix} S_{11}(r) & S_{12}(r+\Delta_1) & S_{13}(r+\Delta_2) \\ S_{21}(r) & S_{22}(r+\Delta_1) & S_{23}(r+\Delta_2) \\ S_{31}(r) & S_{32}(r+\Delta_1) & S_{33}(r+\Delta_2) \\ S_{41}(r) & S_{42}(r+\Delta_1) & S_{43}(r+\Delta_2) \end{pmatrix} \begin{pmatrix} x_1(r) \\ x_2(r+\Delta_1) \\ x_3(r+\Delta_2) \end{pmatrix} = \begin{pmatrix} y_1 \\ y_2 \\ y_3 \\ y_4 \end{pmatrix}$$

In other words, the aim is the minimization of the error propagation in the pseudo-inverse of S. To achieve this, those $\Delta_1$ and $\Delta_2$ need to be determined that minimize the norm of $(S^H S)^{-1} S^H$, among all possible settings. However, the above equation describes only one voxel location in the set of multiple image slices considered. The optimal shift parameters $\Delta_1$, $\Delta_2$ have to be determined as a compromise for preferably all voxels in the image slices.

For this purpose, a system of linear equations can be written concatenating the single-voxel problems given in the above equation for all voxels. The resulting single sensitivity matrix S' comprises the smaller matrices $S_k$ for all voxels as functions of the shift parameters $\Delta_d$ which also can be interpreted as a vector. The corresponding vector elements $x'_i$ and $y'_i$ are formed by the vectors x and y as defined above:

$$\begin{pmatrix} S_1(r_1, \Delta_1, \Delta_2) & & & \\ & S_2(r_2, \Delta_1, \Delta_2) & & \\ & & S_3(r_3, \Delta_1, \Delta_2) & \\ & & & ... \end{pmatrix} \begin{pmatrix} x'_1 \\ x'_2 \\ x'_3 \\ ... \end{pmatrix} = S'x' = \begin{pmatrix} y'_1 \\ y'_2 \\ y'_3 \\ ... \end{pmatrix}$$

An appropriate norm, calculated of the pseudo-inverse $(S'^H S')^{-1} S'^H$, can serve as a measure to select the optimal solutions for the $\Delta_d$:

$$\Delta_d = (\operatorname*{argmin}_{\Delta d}) \| (S'^H S')^{-1} S'^H \|.$$

The resulting shifts $\Delta_d$ can be translated according to the invention into a corresponding phase-modulation scheme of the multi-slice RF pulses.

The matrix S' is a sparse band or diagonal matrix for which efficient numerical inversion routines exist. However, a number of measures can be taken to reduce the numerical effort.

In one embodiment, the size of the matrix S' may be reduced if not all voxels in the image slices are used to optimize the phase-modulation scheme. For this purpose, the potential in-slice position density can be reduced (low-resolution approach), thereby reducing the number of elements in S'. This also implies that the coil sensitivities are rather smooth functions in space. In this way, additionally the performance can further be concentrated on important areas of the image that are of high clinical interest (ROI).

Moreover, prior knowledge on the geometry of the object can be taken into account in the step of deriving the phase-modulation scheme of the RF pulses from the spatial sensitivity profiles of the RF pulses. This prior knowledge can be gained, for example, from a SENSE reference scan which is performed prior to the actual image acquisition. A further approach to reduce the size of the optimization problem is to transform all involved RF receiving coils into a virtual coil system, using, for example, singular value decomposition (SVD) or similar techniques. Thus, only the N (number of image slices) most important virtual coil elements have to be considered in the evaluation.

However, calculating directly $S^H S$ for each location and using all RF coils, as an element of the basic calculation of the pseudo-inverse, is also efficient and avoids neglecting parts of the RF coil information.

The optimization of the phase-modulation scheme according to the invention can also be accelerated by choosing an efficient matrix norm for evaluating the pseudo-inverse with respect to the chosen $\Delta_d$. Statistical means may be applied during the evaluation of the individual diagonal elements of the matrix $(S'^H S')^{-1} S'^H$. Furthermore, the search for the optimal $\Delta_d$ can be performed in a hierarchical manner, starting form a coarse resolution in the $\Delta_d$ space, which can be adapted during the optimization progress. To avoid the need of regridding in the reconstruction, only shifts that are integer multiples of the voxel size may be considered advantageously.

In a preferred embodiment, additional information that is typically applied in the SENSE reconstruction approach (like, for example, the noise correlation matrix, a regularization MR image, or, in the simplest case, a binary mask restricting the coil sensitivity profiles to areas from which MR signals are expected) may also be included in the computation of the pseudo-inverse matrix in the optimization of the phase-modulation scheme.

In a practical embodiment of the invention, the phase-modulation scheme has to be determined separately for each location, i.e. each group of simultaneously excited image slices. The coil sensitivity profiles and the object geometry can vary considerably for different locations, leading to different sets of optimal phase-modulations and corresponding shifts.

The method of the invention described thus far can be carried out by means of a MR device including at least one main magnet coil for generating a uniform static magnetic field within an examination volume, a number of gradient coils for generating switched magnetic field gradients in different spatial directions within the examination volume, a set of RF coils for receiving MR signals from the body in parallel, the RF coils having different spatial sensitivity profiles, a control unit for controlling the temporal succession of RF pulses and switched magnetic field gradients, and a reconstruction unit. The method of the invention can be implemented, for example, by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
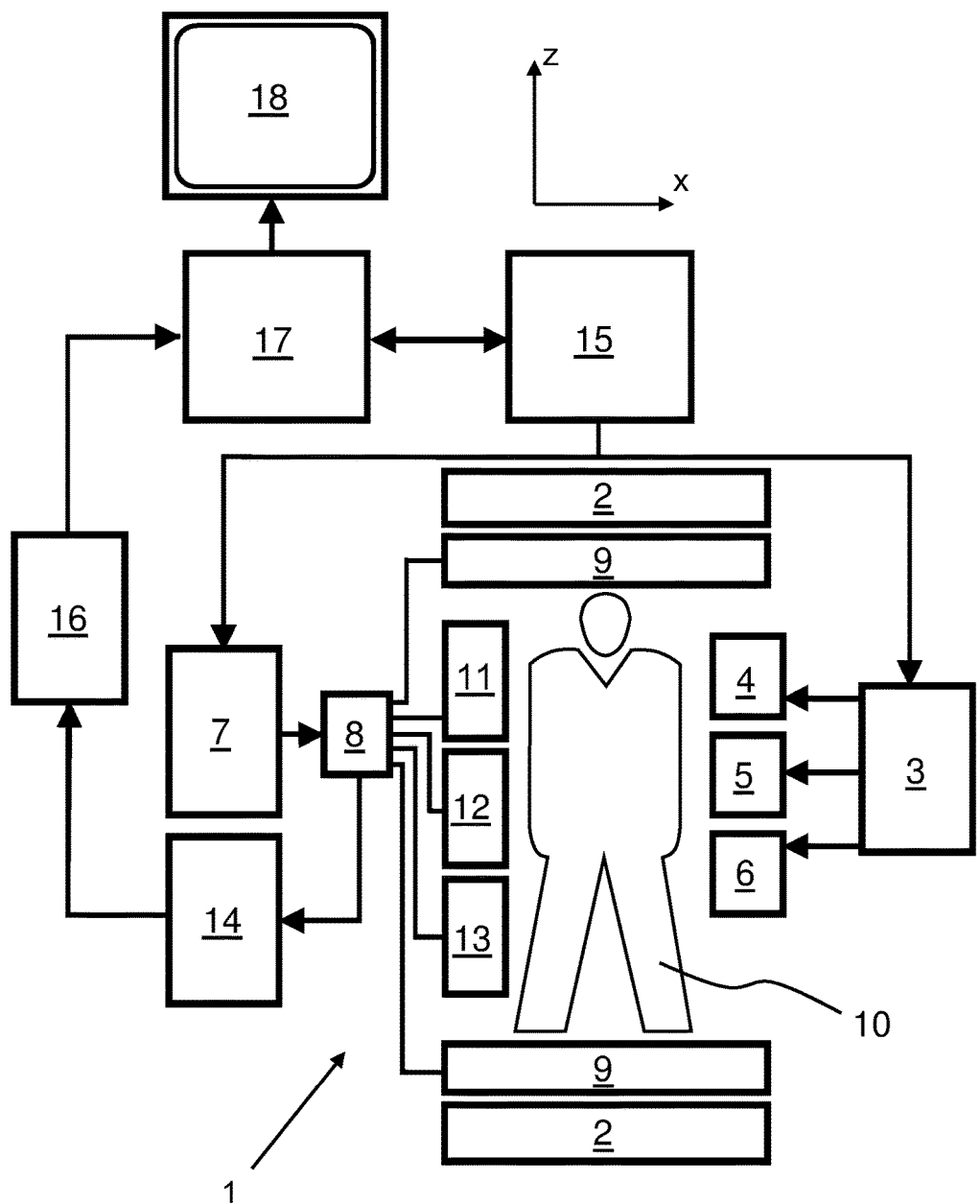
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume.

For generation of MR images of limited regions of the body 10 by means of parallel imaging, a set of local RF coils 11, 12, 13 are placed contiguous to the region selected for imaging.

The resultant MR signals are picked up by the RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
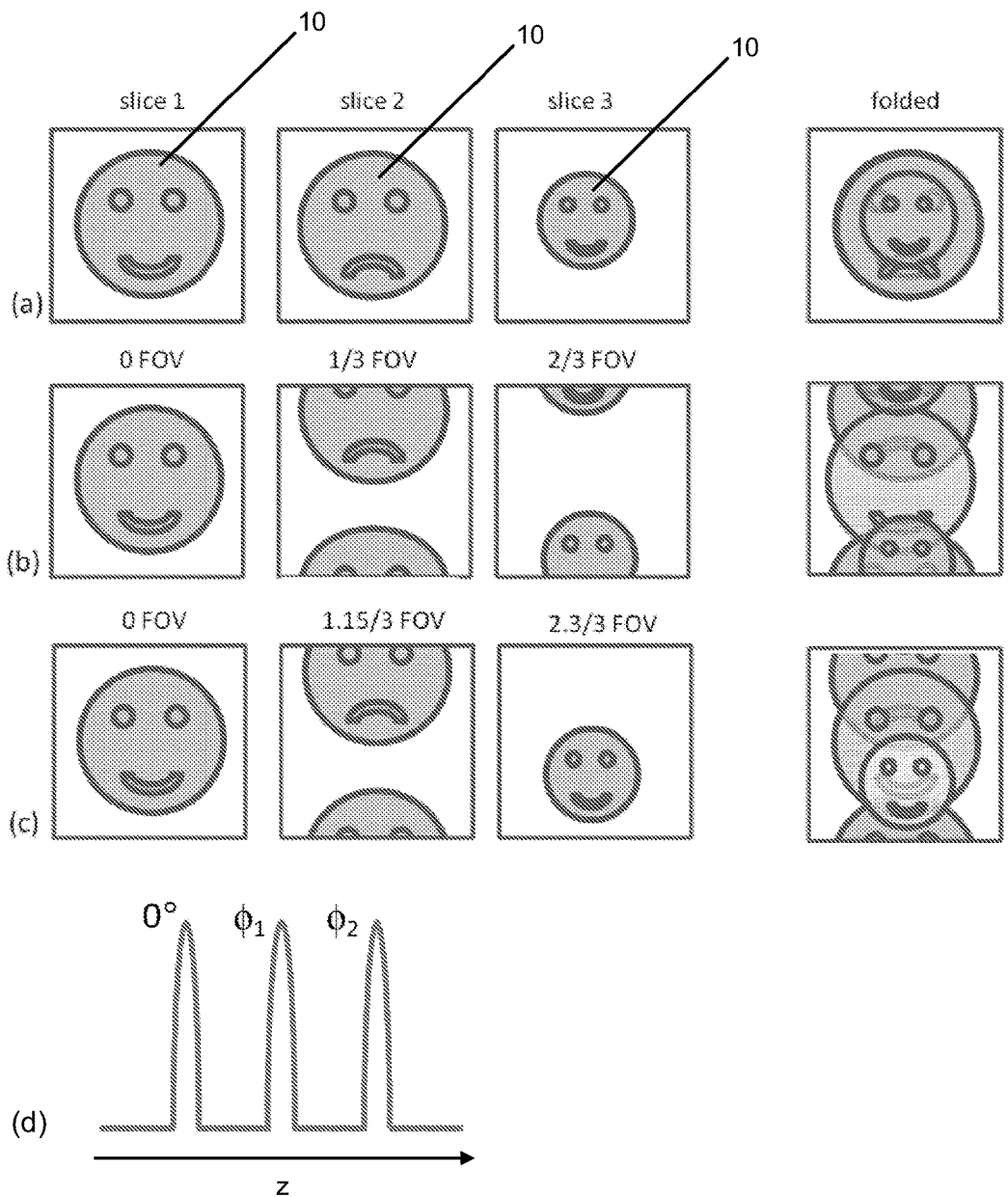
FIG. 2 schematically illustrates the MR image acquisition scheme of the invention.

With continuing reference to FIG. 1 and with further reference to FIG. 2 an embodiment of the imaging approach of the invention is explained.

FIG. 2 illustrates the schemes of three different MR signal acquisition approaches. The object 10 is subjected to an imaging sequence (for example a spin-echo sequence, like the known TSE sequence) comprising multi-slice RF pulses for simultaneously exciting three spatially separate, coplanar image slices (slice 1, slice 2, slice 3) of arbitrary slice thickness. FIG. 2d schematically shows the excitation profile of the multi-slice RF pulses in the slice-selection direction z. $\Phi_1$ and $\Phi_2$ indicate phase shift increments of the RF excitation in slice 2 and slice 3 respectively. Slice 1 is generally excited without phase shift (0°). MR signals are received in parallel via the RF coils 11, 12, 13 having different spatial sensitivities in the slice-selection direction. The acquired MR signals yield slice images superimposed in a 'folded image', as illustrated in FIG. 2 on the right. A MR image for each image slice is reconstructed from the acquired MR signals, wherein MR signal contributions from the different image slices are separated on the basis of the spatial sensitivity profiles of the RF coils 11, 12, 13.

FIG. 2a shows a standard parallel multi-slice approach (see Larkman et al., Journal of Magnetic Resonance, 13, 313-317, 2001). In this case, the phase shift increments are $\Phi_1=\Phi_2=0°$, i.e. no phase-modulation is applied. The folded MR image on the right shows that all slice images significantly overlap in the superposed MR image, making separation very difficult (i.e. numerically ill-conditioned).

In FIG. 2b the conventional CAIPIRINHA approach is illustrated. From phase-encoding step to phase-encoding step, the multi-slice RF pulses apply an individual phase shift to the MR signals of each of the slices 1, 2, and 3. The numerical conditioning of the inverse reconstruction problem is improved by using this shift, which becomes apparent from the more distributed folding behavior in the 'folded' image. CAIPIRINHA uses a fixed phase-modulation scheme of the RF pulses, resulting in a relative shift of adjacent slices by, 0, ⅓ of the FOV, and ⅔ of the FOV in the depicted embodiment. The corresponding fixed RF phase shift increments are $\Phi_1=120°$, $\Phi_2=240°$ for each phase encoding step. A drawback of this fixed scheme is that it does not take a-priori information into account. Thus, the encoding capabilities of the array of receiving RF coils and also the basic structure of the imaging problem are not sufficiently considered. This may result in a sub-optimal phase-modulation and consequently in sub-optimal reconstruction performance.

FIG. 2c shows the approach of the invention, in which no fixed phase-modulation scheme as in CAIPIRINHA is applied. According to the invention, the available coil sensitivity information is used to derive adjusted slice specific phase modulations to optimize the encoding process and, thus, the conditioning of the unfolding problem in order to improve the final image quality. In the depicted embodiment, the optimization procedure results in a relative shift of the adjacent slices by, 0, 1.15/3 of the FOV, and 2.3/3 of the FOV. The corresponding RF phase shift increments are $\Phi_1=140°$, $\Phi_2=280°$ for each phase encoding step (which also fulfill an integer voxel shift condition). A corresponding set of multi-slice RF pulses can be calculated with a periodicity given by the least common multiple of these two phase shifts. This set is then applied during MR signal acquisition in successive order as follows (the numbers in brackets indicate the phase shifts applied to slices 1, 2, and 3 respectively):

1. RF pulse (0°, 140°, 280°),
2. RF pulse (0°, 280°, 200°),
3. RF pulse (0°, 60°, 120°),
4. RF pulse (0°, 200°, 40°),
5. RF pulse (0°, 340°, 320°),
6. . . .

For each successive phase encoding step in the linear phase encoding scheme, the corresponding RF pulses are looped in a cyclic order. As a consequence, the conditioning of the separating problem is improved, which is schematically shown in FIG. 2c. The amount of overlapping MR signal intensity in the 'folded' image is reduced vis-à-vis the conventional CAIPIRINHA approach (FIG. 2b).

In a further embodiment of the invention, a multi-slice gradient echo scan as in example above may be performed, but with the additional application of SENSE in the in-plane phase-encoding direction using an appropriate reduction factor R (for example R=2). To optimize the corresponding phase shift increments also the in-plane SENSE-induced folding of the MR signals may be taken into account.

The invention claimed is:

1. A method of magnetic resonance imaging of an object placed in an examination volume of a magnetic resonance device, the method comprising the steps of:

subjecting the object to an imaging sequence comprising phase-modulated multi-slice radio frequency pulses for simultaneously exciting two or more spatially separate image slices, acquiring magnetic resonance signals which are received in parallel via a set of at least two coils, the at least two radio frequency coils each having different spatial sensitivity profiles, and reconstructing a magnetic resonance image for each image slice from the acquired magnetic resonance signals, wherein magnetic resonance signal contributions from the different image slices are separated on the basis of the spatial sensitivity profiles of the at least two radio frequency coils and on the basis of a slice-specific phase modulation scheme of the radio frequency pulses, wherein the slice-specific phase-modulation scheme of the radio frequency pulses is derived from the spatial sensitivity profiles of the at least two radio frequency coils.

2. The method of claim 1, wherein phase-encoded magnetic resonance signals are acquired by means of the imaging sequence, the slice-specific phase modulation scheme comprising a varying phase shift, wherein an individual phase cycle is applied to the magnetic resonance signals of each image slice.

3. The method of claim 2, wherein the phase shift is linearly incremented from phase-encoding step to phase-encoding step, wherein an individual phase increment is applied to each image slice.

4. The method of claim 1, wherein the slice-specific phase-modulation scheme of the radio frequency pulses is determined such that the conditioning of the inverse problem of the magnetic resonance image reconstruction is optimized.

5. The method of claim 1, wherein knowledge on the geometry of the object is taken into account in the step of deriving the slice-specific phase-modulation scheme of the radio frequency pulses from the spatial sensitivity profiles of the radio frequency pulses.

6. The method of claim 1, wherein the slice-specific phase-modulation scheme is derived by minimizing a norm of $(S^H S)^{-1} S^H$, wherein S is the sensitivity matrix of the at least two radio frequency coils, taking into account an individual spatial shift in the phase-encoding direction for each image slice induced by the phase-modulation of the radio frequency pulses.

7. The method of claim 1, wherein the magnetic resonance signals are acquired with undersampling in the in-plane direction of the image slices, wherein the magnetic resonance images are reconstructed using a parallel image reconstruction algorithm selected from the group consisting of SENSE, SMASH and GRAPPA.

8. A magnetic resonance device including:
at least one main magnet coil for generating a uniform, static magnetic field within an examination volume,
a number of gradient coils for generating switched magnetic field gradients in different spatial directions within the examination volume,
at least two radio frequency coils having different spatial sensitivity profiles,
a control unit for controlling the temporal succession of radio frequency pulses and switched magnetic field gradients, and a reconstruction unit, and
at least one processor programmed to:
perform imaging of an object to an imaging sequence comprising phase-modulated multi-slice radio frequency pulses for simultaneously exciting two or more spatially separate image slices, wherein a slice-specific phase-modulation scheme of the radio frequency pulses is derived from the spatial sensitivity profiles $S_{ij}(r)$ of the at least two radio frequency coils where $S_{ij}(r)$ denotes the coil sensitivity for coil j and slice i at in-plane location r,
acquire magnetic resonance signals, and
reconstruct a magnetic resonance image for each image slice from the acquired magnetic resonance signals,
wherein magnetic resonance signal contributions from the different image slices are separated on the basis of the spatial sensitivity profiles $S_{ij}(r)$ of the at least two coils and on the basis of the slice-specific phase modulation scheme of the radio frequency pulses.

9. A non-transitory computer readable medium storing instructions executable by at least one processor of a magnetic resonance device, the instructions including:
generating an imaging sequence comprising phase-modulated multi-slice radio frequency pulses for simultaneously exciting two or more spatially separate image slices, wherein a phase-modulation scheme of the radio frequency pulses is derived from spatial sensitivity profiles of at least two radio frequency coils,
acquiring magnetic resonance signals, and
reconstructing a magnetic resonance image for each image slice from the acquired magnetic resonance signals, wherein magnetic resonance signal contributions from the different image slices are separated on the basis of the spatial sensitivity profiles of the at least two radio frequency coils and on the basis of the phase modulation scheme of the pulses.

* * * * *